US008041064B2

(12) United States Patent
Kimura

(10) Patent No.: US 8,041,064 B2

(45) Date of Patent: Oct. 18, 2011

(54) CARD TYPE MEMS MICROPHONE

(75) Inventor: Norio Kimura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 523 days.

(21) Appl. No.: 12/298,243

(22) PCT Filed: Mar. 20, 2007

(86) PCT No.: PCT/JP2007/055758

§ 371 (c)(1),
(2), (4) Date: Oct. 23, 2008

(87) PCT Pub. No.: WO2007/129507

PCT Pub. Date: Nov. 15, 2007

(65) Prior Publication Data

US 2009/0161894 A1 Jun. 25, 2009

(30) Foreign Application Priority Data

May 9, 2006 (JP) ................................ 2006-130299

(51) Int. Cl.
*H04R 1/20* (2006.01)
*H01L 29/84* (2006.01)

(52) U.S. Cl. ....................................... 381/348; 257/416

(58) Field of Classification Search .................... 438/53; 257/416, E29.324; 381/346–348
See application file for complete search history.

(56) References Cited

U.S. PATENT DOCUMENTS

2007/0189574 A1* 8/2007 Suzuki ......................... 381/396

FOREIGN PATENT DOCUMENTS

JP 2001-245186 9/2001
JP 2007-60228 3/2007

* cited by examiner

*Primary Examiner* — Calvin Lee

(74) *Attorney, Agent, or Firm* — McDermott Will & Emery LLP

(57) ABSTRACT

It is an object of the invention to provide an MEMS microphone having a directionality. A card type MEMS microphone according to the invention comprises a substrate having a first through hole and a second through hole, an MEMS chip in which a space formed by a diaphragm electrode and a silicon substrate is mounted in a position to surround an outlet of the first through hole and which serves to convert a sound signal propagated to the diaphragm electrode into an electric signal, and an acoustic resisting member mounted in a position covering the first through hole at a substrate surface on an opposite side to a side on which the MEMS chip is mounted, and the substrate has a terminal for transmitting an electric signal output from the MEMS chip to an electronic apparatus and takes a shape of a card which can be attached to and removed from the electronic apparatus, and the second through hole is a hole which a sound signal passes to be propagated to the diaphragm electrode around the substrate.

5 Claims, 8 Drawing Sheets

PRIOR ART

CARD TYPE MEMS MICROPHONE

RELATED APPLICATIONS

This application is the U.S. National Phase under 35 U.S.C. §371 of International Application No. PCT/JP2007/055758, filed on Mar. 20, 2007, which in turn claims the benefit of Japanese Application No. 2006-130299, filed on May 9, 2006, the disclosures of which Applications are incorporated by reference herein.

TECHNICAL FIELD

The present invention relates to a small-sized microphone using a micromachining technique for practically using a semiconductor technology.

BACKGROUND ART

As one of microphones which have conventionally been used in an information communicating terminal such as a portable telephone, an electret condenser microphone (ECM) using an organic film can be taken. The ECM is a microphone for disposing an electret causing a polymer material to have an electric charge on one of electrodes of a condenser and converting a change in an electrostatic capacity fluctuating corresponding to a sound pressure into a voltage change.

As one of characteristics of the microphone, a directionality can be taken. For example, a "non-directionality" (an omnidirectionality) having no directionality, a "unidirectionality" which easily catches a sound in a specific direction, an "ultradirectionality" which causes a directionality to have a narrower angle, and a "bidirectionality" which greatly catches a sound source in two forward and backward directions. The microphone is designed to have a specific directionality depending on uses.

FIG. 12A is a view showing a sectional structure of an ECM having a unidirectionality. As shown in FIG. 12A, in a microphone 100, a diaphragm 11 such as a metal conductor, a fixed electrode 12 having an electret film 13 formed thereon, and a printed circuit board 18 having a circuit element mounted thereon are disposed in a case 17 having a first sound hole 15A. An interval between the diaphragm 11 and the fixed electrode 12 is held by a spacer 14, and a back air chamber 16 is formed between the fixed electrode 12 and the printed circuit board 18. Furthermore, the case 17 has a second sound hole 15B formed on an opposite side to the first sound hole 15A. The diaphragm 11 is obtained by deposing aluminum on a film, for example.

The electret film 13 is a substance which is generally charged permanently (charge held) irrespective of an external electric field, and FEP (Fluorinated Ethylene Propylene fluorinated ethylene propylene resin) to be a fluororesin is used.

In the microphone 100, when the diaphragm 11 is vibrated at a sound pressure, an electrostatic capacity of a plate capacitor constituted by the diaphragm 11 and the fixed electrode 12 is changed and converted into a voltage change, and the voltage change is output from the microphone 100 through an amplifying circuit.

More specifically, a sound made on the second sound hole 15B side first enters through the sound hole 15B and reaches a back side of the diaphragm 11 (an indirect sound). The same sound turns around and also reaches a surface side of the diaphragm 11 with a slight delay (a direct sound). An obstacle (an acoustic resisting member) is put from the second sound hole 15B to the back side of the diaphragm 11 so that the indirect sound is delayed to arrive in phase with the direct sound. Consequently, the sound is offset as the same amount of energy generated on the surface and the back of the diaphragm 11 at the same time and is not electrically output.

On the other hand, a sound made on the first sound hole 15A side is first transmitted to the surface side of the diaphragm 11. Referring to the subsequent turn toward the back side, the arrival is further delayed due to the delay caused by the turn and the delay caused by the obstacle. Based on the time difference, the energy is not offset but is output electrically. Accordingly, the microphone 100 has a single forward directionality.

Thus, the ECM serves to convert the change in the electrostatic capacity fluctuating corresponding to the sound pressure into the voltage change. By providing a hole on a case, it is possible to design a directionality. In recent years, however, a reduction in a mounting cost has been demanded with a further reduction in a size and a thickness in the ECM. In the conventional ECM, an electret material to be an organic material which is less resistant to heat is used as described above. Therefore, the ECM cannot deal with surface mounting through a solder reflow and is to be attached to a substrate through a connector provided in the ECM so that a high cost is required for a connector component.

Therefore, there has been proposed a small-sized microphone (MEMS (Micro Electro Mechanical Systems) microphone) using a micromachining technique for practically using a semiconductor technology. FIG. 12B shows a sectional structure of the MEMS microphone.

As shown in FIG. 12B, an MEMS microphone 200 has a diaphragm electrode 23 and an electret film 24 formed on a silicon substrate 21 through a first insulating layer 22. A fixed electrode 26 provided with a sound hole 27 is formed thereon through a second insulating layer 25. Moreover, a back air chamber 28 is formed on a back face of the diaphragm electrode 23 by etching of the silicon substrate 21.

The diaphragm electrode 23 is formed of conductive polysilicon and the electret film 24 is formed by a silicon nitride film or a silicon oxide film. Moreover, the fixed electrode 26 is formed by laminating the conductive polysilicon and the silicon oxide film or the silicon nitride film.

In the MEMS microphone 200, when the diaphragm electrode 23 is vibrated at a sound pressure, an electrostatic capacity of a plate capacitor constituted by the diaphragm electrode 23 and the fixed electrode 26 is changed and is fetched as a voltage change.

In the MEMS microphone 200, thus, an electret material to be an inorganic material is used. Therefore, it is possible to implement reflow mounting which cannot be carried out in a conventional ECM, to decrease the number of components and to reduce a size and a thickness (see Patent Document 1).

Patent Document 1: JP-A-2001-245186 Publication

DISCLOSURE OF THE INVENTION

Problems that the Invention is to Solve

However, the MEMS microphone is usually mounted on a substrate. Therefore, a sound single is propagated from only the sound hole 27 side to the diaphragm electrode 23. For this reason, it is hard for the conventional MEMS microphone to have a directionality.

In consideration of the problem, it is an object of the invention to provide an MEMS microphone having a directionality.

Means for Solving the Problems

A card type MEMS microphone according to the invention comprises a substrate having a first through hole and a second through hole, an MEMS chip in which a space formed by a diaphragm electrode and a silicon substrate is mounted in a position to surround an outlet of the first through hole and which serves to convert a sound signal propagated to the diaphragm electrode into an electric signal, and an acoustic resisting member mounted in a position covering the first through hole at a substrate surface on an opposite side to a side on which the MEMS chip is mounted, and the substrate has a terminal for transmitting an electric signal output from the MEMS chip to an electronic apparatus and takes a shape of a card which can be attached to and removed from the electronic apparatus, and the second through hole is a hole which a sound signal passes to be propagated to the diaphragm electrode around the substrate.

By the structure, the sound signal is propagated to the diaphragm electrode of the MEMS chip from an opposite side (a back side) to the substrate surface on which the MEMS chip is mounted in addition to a substrate surface side (a surface side) on which the MEMS chip is mounted. Thus, the sound signal can be propagated from both sides. Therefore, the degree of design freedom of a directionality is enhanced.

Moreover, card type MEMS microphones having various directionalities are prepared so that a user can easily vary a microphone characteristic of an electronic apparatus by removing/inserting the card type MEMS microphone from/to an electronic apparatus to carry out a change depending on uses and an environment.

In the card type MEMS microphone according to the invention, furthermore, the second through hole takes a shape of a circular arc almost around the MEMS chip.

In the card type MEMS microphone according to the invention, moreover, when a sound is generated on an opposite side to the substrate surface on which the MEMS chip is mounted, a signal of the sound which passes the acoustic resisting member and the first through hole and is propagated from a back side of the diaphragm electrode and a signal of the sound which passes the second through hole and is propagated from a surface side of the diaphragm electrode reach the diaphragm electrode almost simultaneously.

By the structure, when a sound source is provided on the opposite side to the substrate surface on which the MEMS chip is mounted, the sound signals reach the diaphragm electrode from the surface side and the back side at the same time. Therefore, the sound singles are offset as the same amount of energy generated on the surface and the back of the diaphragm electrode at the same time and is not electrically output.

On the other hand, when the sound source is provided on the substrate surface side on which the MEMS chip is mounted, the sound signals reaching the diaphragm electrode from the surface side and the back side have a time difference. Therefore, the energy is not offset but is electrically output. Accordingly, the card type MEMS microphone according to the invention has a unidirectionality.

Moreover, the invention provides a portable telephone on which the card type MEMS microphone is mounted.

By the structure, a user can easily vary a microphone characteristic of the portable telephone by removing/inserting the card type MEMS microphone from/into the portable telephone to carry out a change depending on uses and an environment.

Advantage of the Invention

According to the invention, it is possible to provide an MEMS microphone having a directionality.

EXPLANATION OF THE DESIGNATIONS

Figure 1:
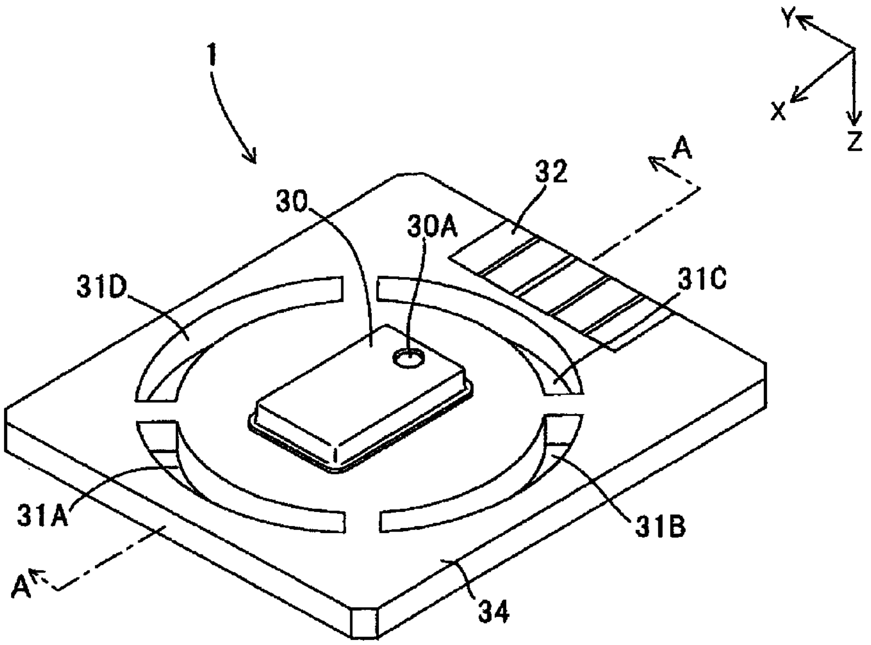
FIG. 1 is a perspective view showing an appearance of a card type MEMS microphone according to a first embodiment.

1 card type MEMS microphone
30 shield case
31A, 31B, 31C, 31D through hole (second through hole)
32 terminal
33 case
34 substrate
35 through hole (first through hole)
40 MEMS chip
50 acoustic resisting member

BEST MODE FOR CARRYING OUT THE INVENTION

Embodiments according to the invention will be described below in detail with reference to the drawings.

First Embodiment

FIG. 1 is a perspective view showing an appearance of a card type MEMS microphone according to a first embodiment.

Figure 2:
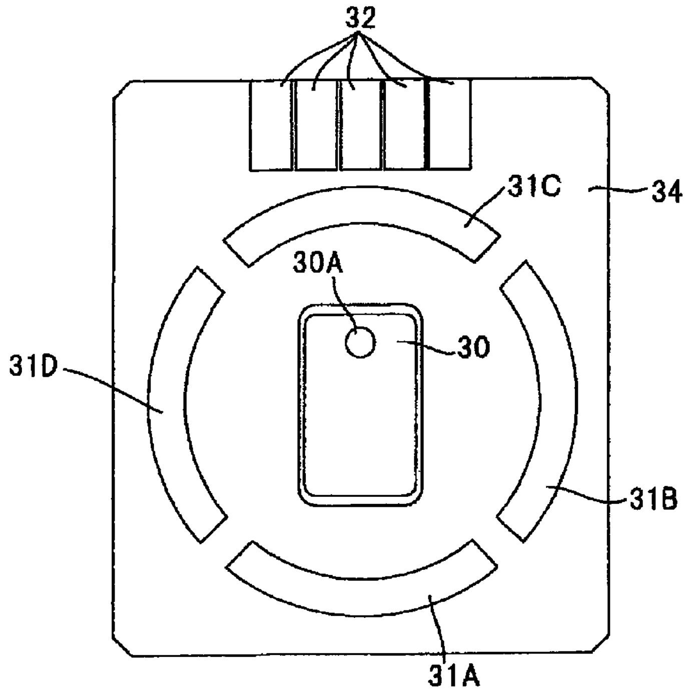
FIG. 2 is a plan view showing the card type MEMS microphone according to the first embodiment.
Figure 3:
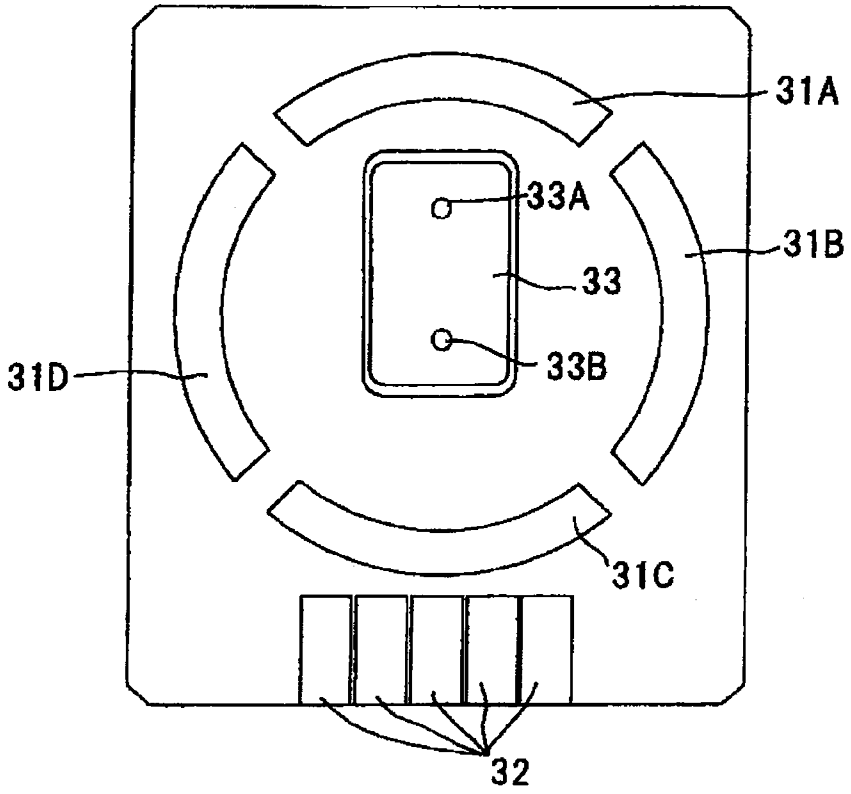
FIG. 3 is a bottom view showing the card type MEMS microphone according to the first embodiment.

FIG. 2 is a plan view showing a card type MEMS microphone according to the embodiment. FIG. 3 is a bottom view showing the card type MEMS microphone according to the embodiment.

Figure 4:
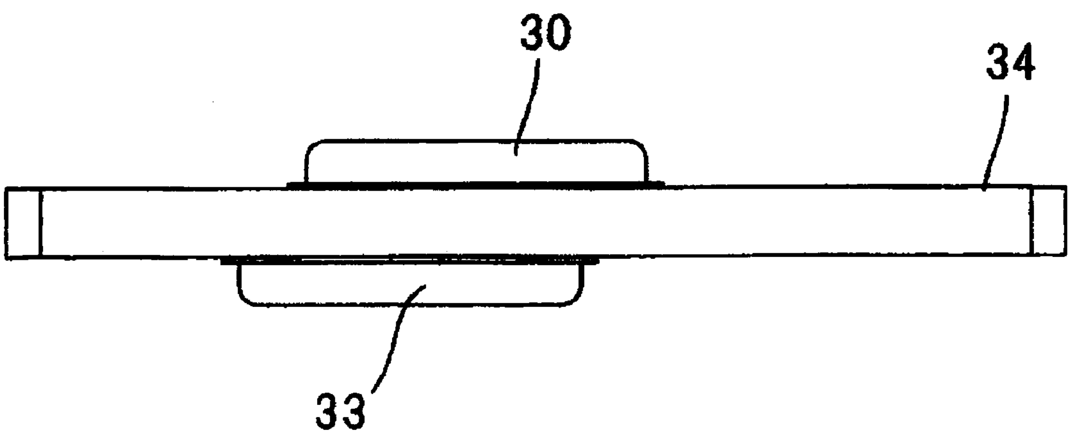
FIG. 4 is a right side view showing the card type MEMS microphone according to the first embodiment.
Figure 5:
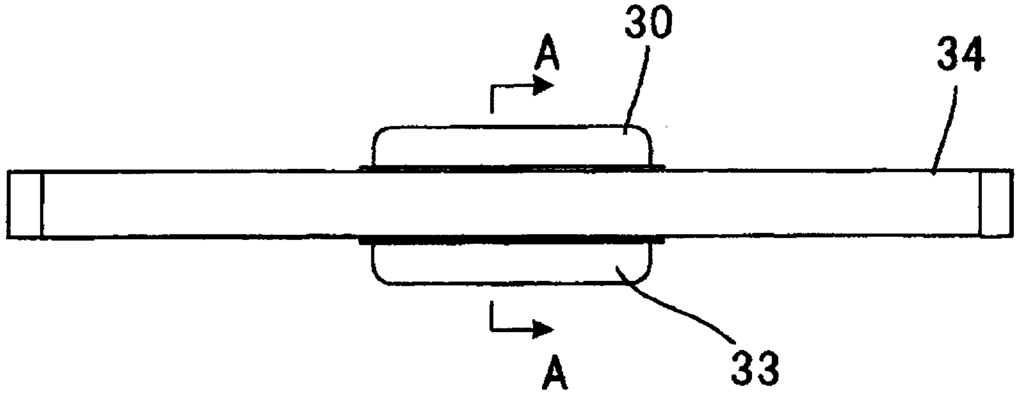
FIG. 5 is a front view showing the card type MEMS microphone according to the first embodiment.

FIG. 4 is a right side view showing the card type MEMS microphone according to the embodiment. FIG. 5 is a front view showing the card type MEMS microphone according to the embodiment.

As shown in FIGS. 1 and 2, a card type MEMS microphone 1 according to the embodiment comprises a rectangular card type substrate 34 having four corners cut obliquely, a shield case 30 for covering an MEMS chip mounted on an almost central part of the card type substrate 34, and a terminal portion 32 provided on one of sides of the card type substrate 34. In the following description, a side on which the shield case 30 is mounted will be referred to as a surface side of the substrate 34 and an opposite side thereof will be referred to as a back side of the substrate 34.

The card type substrate 34 is provided with arcuate through holes (slits) 31A, 31B, 31C and 31D which are continuously linked almost around the MEMS chip in the shield case 30.

The shield case 30 serves to protect the MEMS chip mounted therein from an external noise and has a sound hole 30A.

The MEMS chip serves to convert a sound signal caught by a diaphragm electrode into an electric signal and the terminal portion 32 formed on the substrate 34 serves as a connecting portion for transmitting the electric signal to an electronic apparatus to which the card type MEMS microphone 1 is connected.

A case 33 including an acoustic resisting member is mounted on the back side of the card type MEMS microphone 1 as shown in FIG. 3. The case 33 has sound holes 33A and 33B in target positions from a center, respectively. The acoustic resisting member is an element for regulating a time delay (phase) of a sound signal.

FIG. 4 is a side view showing the card type microphone 1 according to the first embodiment as seen in a Y direction of FIG. 1. FIG. 5 is a front view showing the card type microphone according to the first embodiment as seen in an X direction of FIG. 1.

Figure 6:
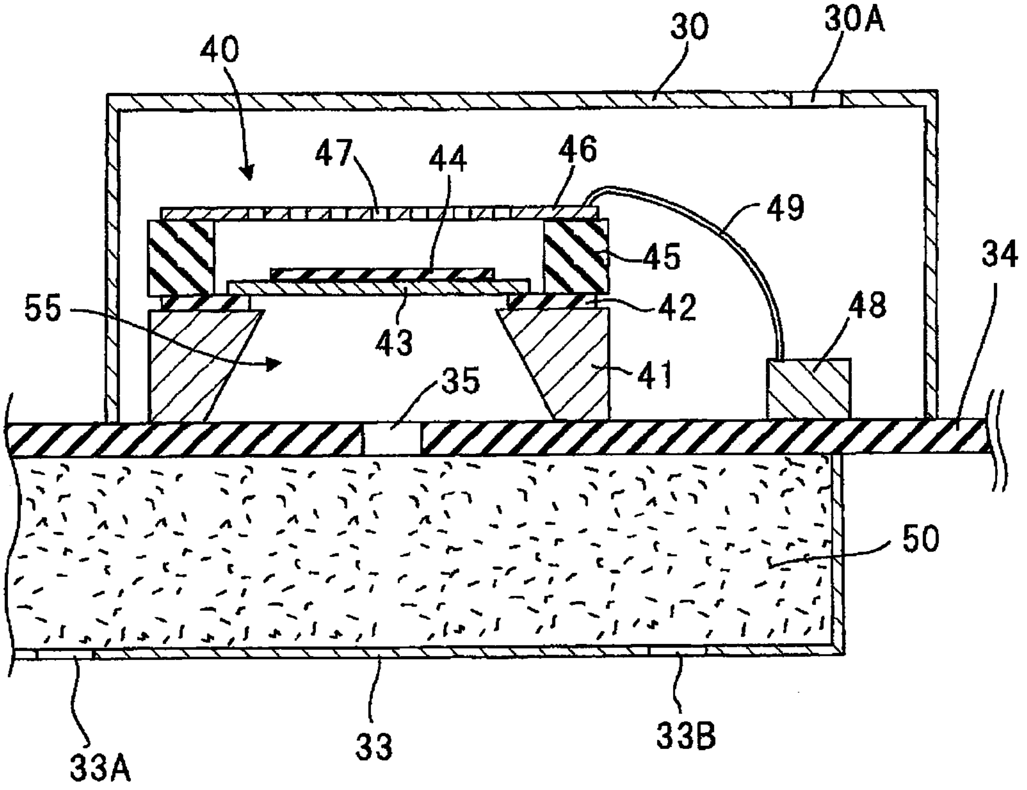
FIG. 6 is a sectional view showing a main part of an A-A section in FIG. 1.

FIG. 6 is an enlarged view showing a main part of an A-A line section in FIG. 1. As shown in FIG. 6, the substrate 34 has a through hole 35 and an MEMS chip 40 is mounted in a position which covers an outlet of the through hole 35 at the surface side. Moreover, an amplifying circuit 48 for amplifying an electric signal of the MEMS chip 40 is electrically connected through a wire 49. The MEMS chip 40 and the amplifying circuit 48 are covered with the shield case 30.

More specifically, the MEMS chip 40 has a diaphragm electrode 43 and an electret film 44 formed on a silicon substrate 41 through a first insulating layer 42. Moreover, a fixed electrode 46 provided with a sound hole 47 is formed thereon through a second insulating layer 45. Furthermore, a back air chamber 55 is formed on a back face of the diaphragm electrode 43 by etching the silicon substrate 41, and an outlet of the through hole 35 of the substrate 34 is surrounded by the back air chamber 55.

The diaphragm electrode 43 is formed of conductive polysilicon and the electret film 44 is formed by a silicon nitride film or a silicon oxide film, and furthermore, the fixed electrode 46 is formed by laminating the conductive polysilicon and the silicon oxide film or the silicon nitride film.

When a sound signal passes the sound hole A of the shield case 30 so that the diaphragm electrode 43 of the MEMS chip 40 is vibrated at a sound pressure, an electrostatic capacity of a plate capacitor constituted by the diaphragm electrode 43 and the fixed electrode 46 is changed and fetched as a voltage change. An electric signal is amplified by the amplifying circuit 48 and is then transmitted to the terminal 32 on the substrate 34.

On the other hand, the case 33 is mounted on the back side of the substrate 34 so as to cover the back side of the through hole 35 of the substrate 34, and an acoustic resisting member 50 is provided therein. The case 33 has a sound hole 33A and a sound hole 33B, and a part of the sound signal enters through the sound holes 33A and 33B, passes the acoustic resisting member 50 in the case 33 and reaches the through hole 35 of the substrate 34, and furthermore, is propagated from the back side to the diaphragm electrode 43 of the MEMS chip 40.

It is preferable to determine dimensions and positions of the through holes 31A to 31D and a characteristic of the acoustic resisting member 50 described above in consideration of the directionality of the card type MEMS microphone. In the card type MEMS microphone 1 according to the first embodiment, the shapes of the through holes 31A, 31B, 31C and 31D, a distance from the MEMS chip 40 and the characteristic of the acoustic resisting member are determined in such a manner that the sound signals reach the diaphragm electrode 43 from the surface side and the back side at the same time when the sound source is provided on the back side of the substrate 34 in order to have a unidirectionality.

More specifically, for example, when a design is carried out to set a dimension of the card to be approximately length (x direction) 15 [mm]×width (y direction) 13 [mm]×thickness (z direction) 3 [mm], to set a diameter of an arcuate through hole to be 10 [mm] and to set a slit width to be 1 [mm] and a proper acoustic resisting member is provided, the unidirectionality can be obtained.

Figure 7A:
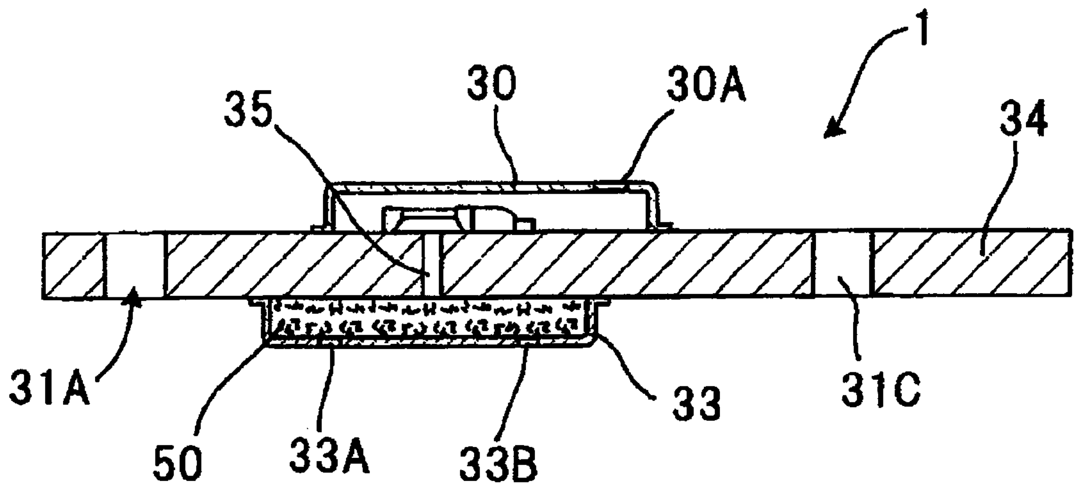
FIG. 7A is a view showing the A-A section in FIG. 1.
Figure 7B:
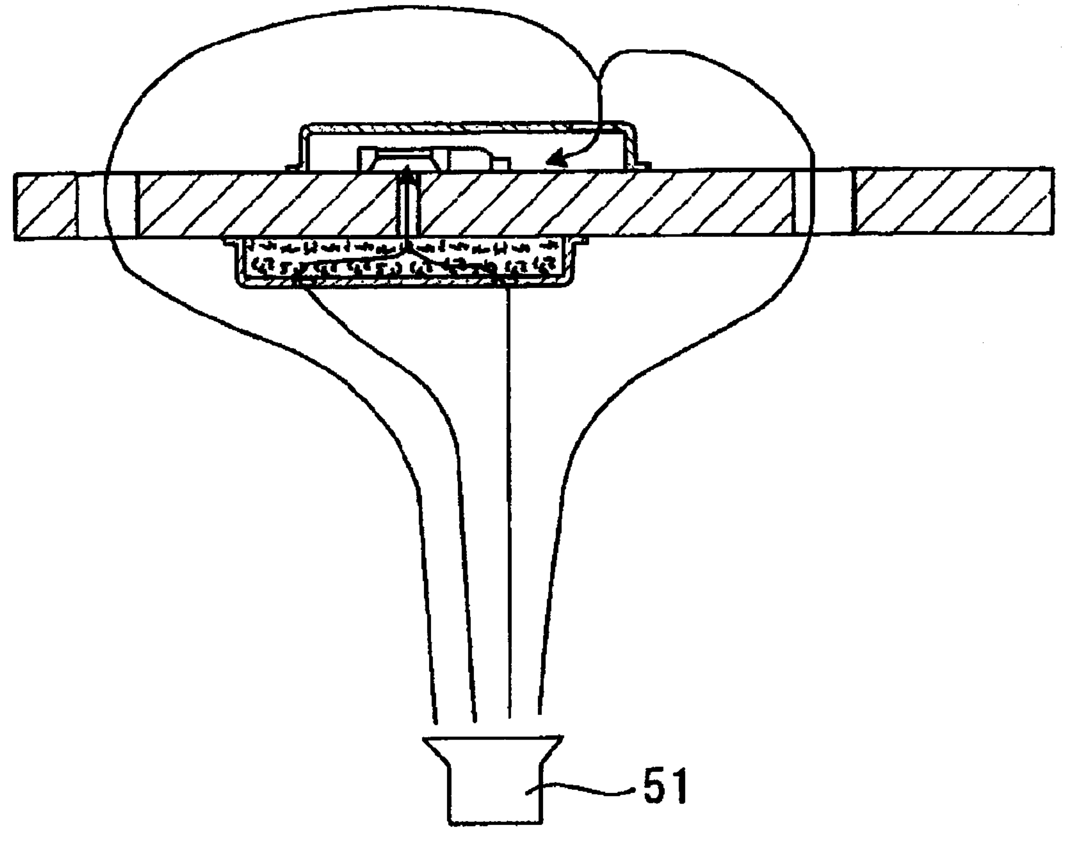
FIG. 7B is a view for explaining a state of a propagation of a sound signal in the case in which a sound source is provided on a back side of the card type microphone according to the first embodiment.
Figure 7C:
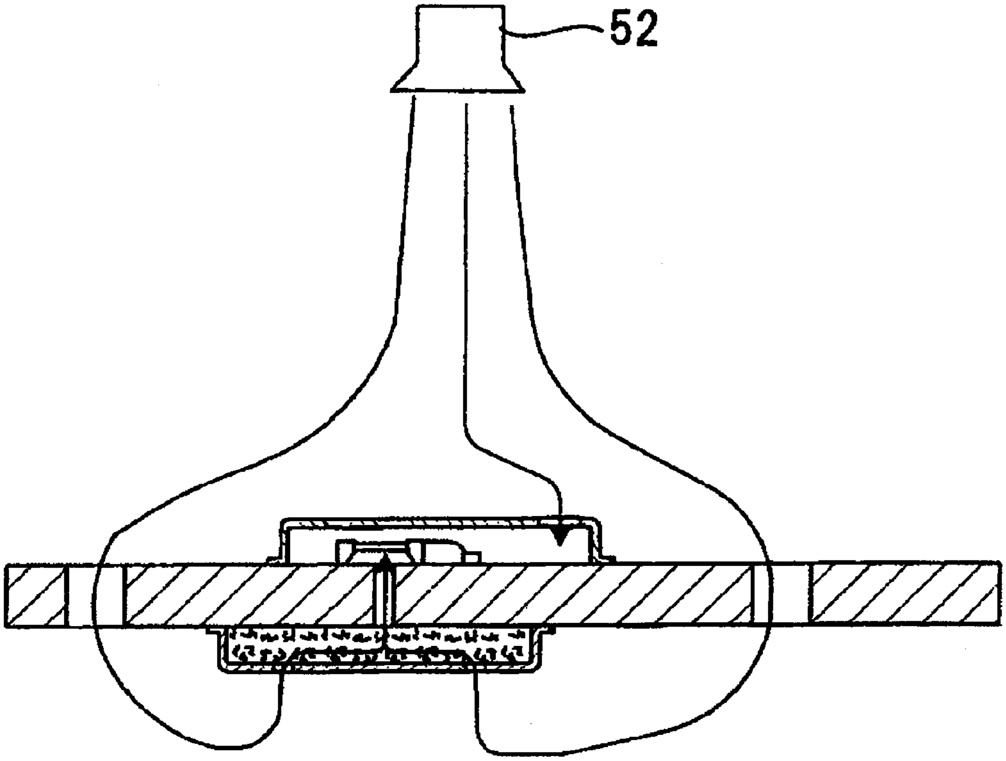
FIG. 7C is a view for explaining the state of the propagation of the sound signal in the case in which the sound source is provided on the back side of the card type microphone according to the first embodiment.

Next, description will be given to an operation of the card type MEMS microphone 1 having the structure described above. FIG. 7A is a view showing the A-A section in FIG. 1. FIG. 7B is a view for explaining a state of a propagation of a sound signal in the case in which a sound source is provided on a back side of the card type microphone according to the first embodiment. FIG. 7C is a view for explaining the state of the propagation of the sound signal in the case in which the sound source is provided on the back side of the card type microphone according to the first embodiment. FIGS. 7B and 7C are sectional views for the same positions as in FIG. 7A, and the designations are omitted and the state of the propagation of the sound signal is shown.

As shown in FIG. 7B, when a sound source 51 is positioned in a distant place on the back side of the card type MEMS microphone 1, a sound signal made in the sound source 51 first enters through the sound holes 33A and 33B of the case 33 and passes the acoustic resisting member 50, and furthermore, passes the through hole 35 of the substrate 34 and reaches the back side of the diaphragm electrode 43. The sound signal propagated from the back side to the diaphragm electrode 43 is set to be an indirect sound.

On the other hand, the same sound passes the arcuate through holes such as the through holes 31A and 31C of the substrate 34 and turns around to the surface side of the substrate 34, and furthermore, passes the sound hole 30A of the shield case 30 and reaches the surface side of the diaphragm electrode 43 of the MEMS chip 40. The sound signal propagated from the surface side to the diaphragm electrode 43 is set to be a direct sound.

At this time, when the sound signal (the indirect sound) reaching the diaphragm electrode 43 from the back side of the substrate 34 passes the acoustic resisting member 50 (the obstacle), a time delay (a phase delay) is generated and the sound signal arrives in phase with the direct sound. Accordingly, the sound is offset as the same amount of energy generated on the surface and the back of the diaphragm electrode 43 at the same time and is not electrically output.

Next, description will be given to the case in which a sound source 52 is positioned in a distant place on the surface side of the card type MEMS microphone 1. As shown in FIG. 7C, when the sound source 52 is positioned in the distant place on the surface side of the card type MEMS microphone 1, the sound signal generated in the sound source 52 is first transmitted to the surface side of the diaphragm electrode 43.

Moreover, the same signal passes the arcuate through holes such as the through holes 31A and 31C of the substrate 34, turns around to the back side of the substrate 34, enters through the sound holes 33A and 33B of the case 33 and passes the acoustic resisting member 50, and furthermore, passes the through hole 15 of the substrate 34 and reaches the back side of the diaphragm electrode 43. The sound signal turning around to the back side has a long moving distance, and furthermore, a time delay is generated by the acoustic resisting member 50. As compared with the sound signal reaching the diaphragm electrode 43 from the surface side, therefore, the arrival at the diaphragm electrode is delayed. Because of the time difference, accordingly, the energy is not offset but is electrically output.

As described above, the card type MEMS microphone 1 according to the first embodiment has a unidirectionality toward the surface side. In the card type MEMS microphone 1 according to the first embodiment, thus, the through hole (the second through hole) surrounding the MEMS chip and the through hole (the first through hole) linked to the back air chamber on the back side of the diaphragm of the MEMS chip are provided on the card type substrate on which the MEMS chip is mounted, and the acoustic resisting member is used on the opposite side to the side on which the MEMS chip is mounted. Consequently, the unidirectionality can be possessed.

Second Embodiment

Figure 8:
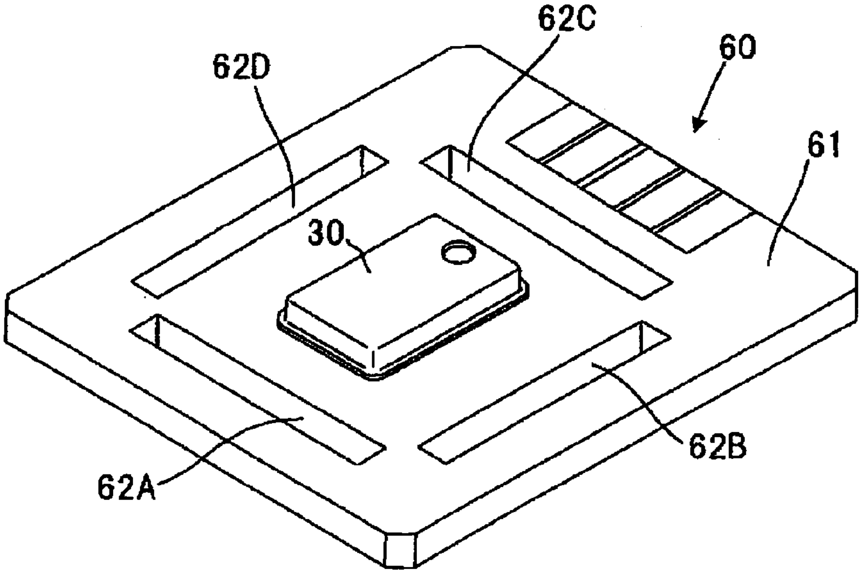
FIG. 8 is a perspective view showing an appearance of a card type MEMS microphone according to a second embodiment.
Figure 9:
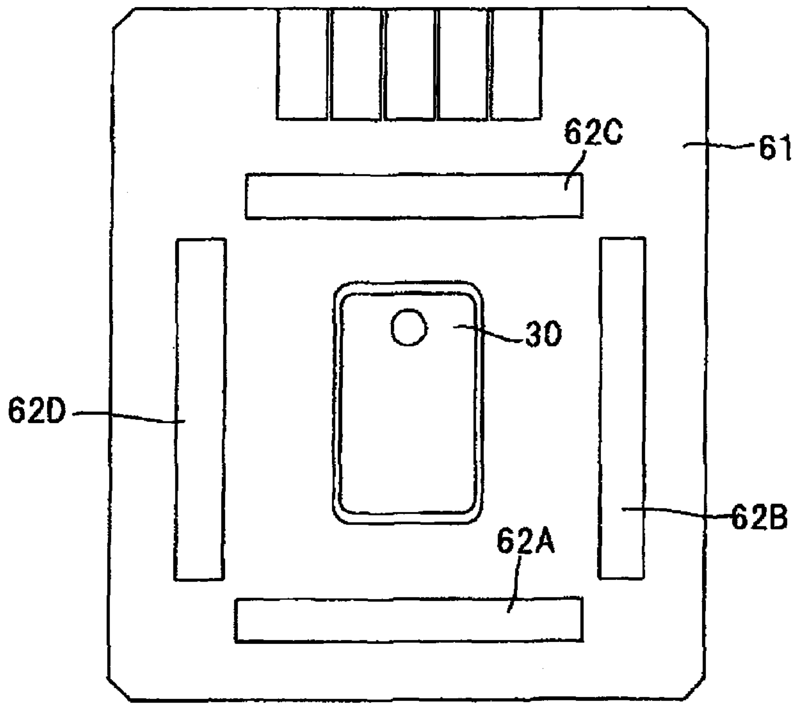
FIG. 9 is a plan view showing the card type MEMS microphone according to the second embodiment.
Figure 10:
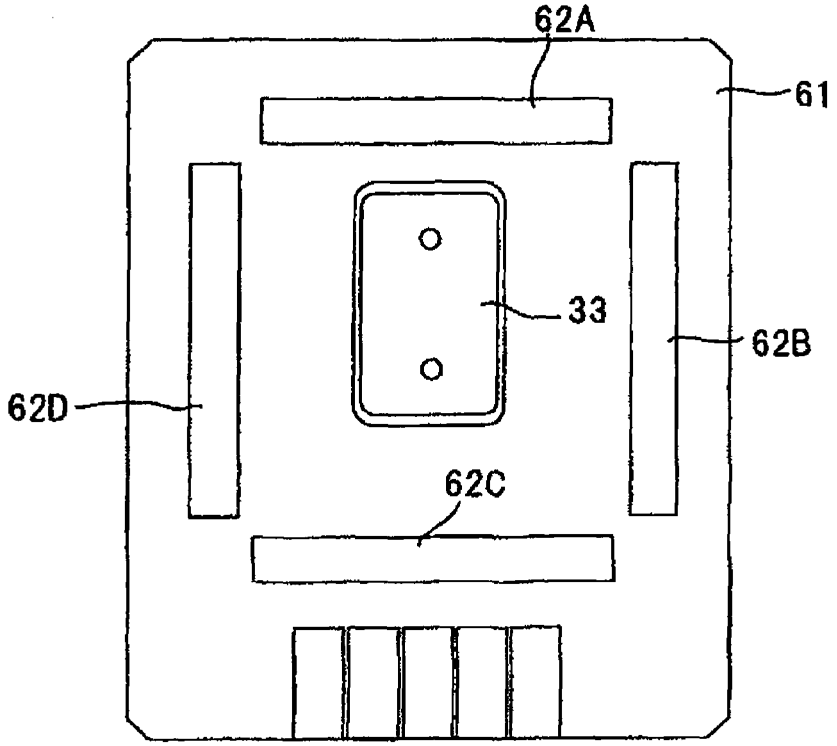
FIG. 10 is a bottom view showing the card type MEMS microphone according to the second embodiment.

FIG. 8 is a perspective view showing an appearance of a card type MEMS microphone according to a second embodiment. FIG. 9 is a plan view showing the card type MEMS microphone according to the embodiment. FIG. 10 is a bottom view showing the card type MEMS microphone according to the embodiment. In the following description, the same components as those described above have the same reference numerals and description thereof will be omitted.

A card type MEMS microphone 60 according to the second embodiment is different from that in the first embodiment in that a card type substrate 61 is provided with rectangular through holes 62A, 62B, 62C and 62D in positions to surround respective sides almost around an MEMS chip in a shield case 30 as shown in FIG. 8.

It is preferable to determine dimensions and positions of the through holes 62A to 62D and a characteristic of an acoustic resisting member 50 in consideration of the directionality of the card type MEMS microphone. In the card type MEMS microphone 60 according to the second embodiment, the shapes of the through holes 62A, 62B, 62C and 62D, a distance from an MEMS chip 40 and the characteristic of the acoustic resisting member are determined in such a manner that the sound signals reach a diaphragm electrode 43 from a surface side and a back side at the same time when a sound source is provided on the back side of the substrate 61 in order to have a unidirectionality.

By the structure, in the card type MEMS microphone 60 according to the first embodiment, a through hole (a second through hole) surrounding the MEMS chip and a through hole (a first through hole) linked to a back air chamber on the back side of the diaphragm of the MEMS chip are provided on the card type substrate on which the MEMS chip is mounted, and the acoustic resisting member is used on an opposite side to the side on which the MEMS chip is mounted. Consequently, the unidirectionality can be possessed.

Third Embodiment

Figure 11A:
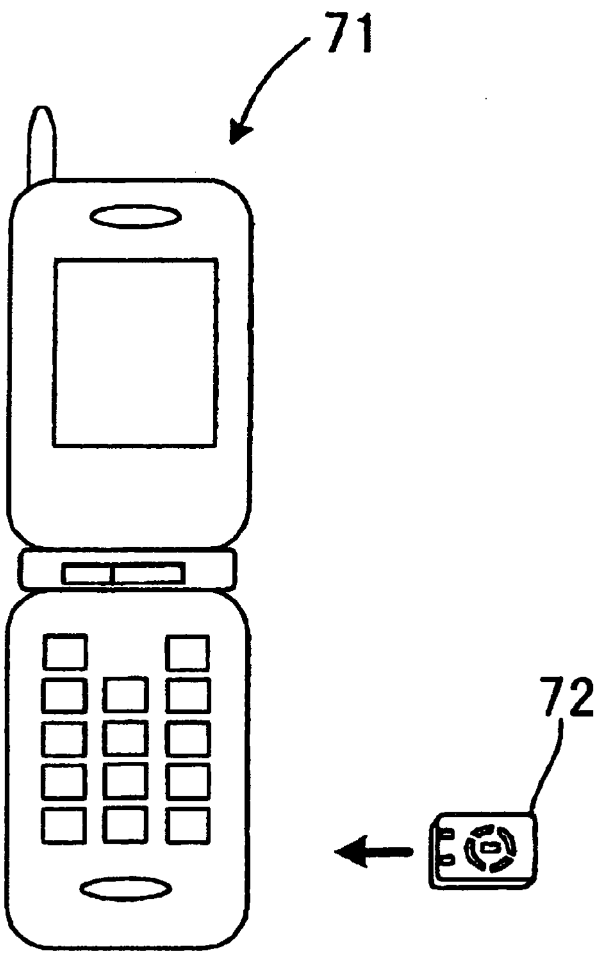
FIG. 11A is a view for explaining an application example of the card type MEMS microphone and FIG. 11B is a side view showing a portable telephone.
Figure 11B:
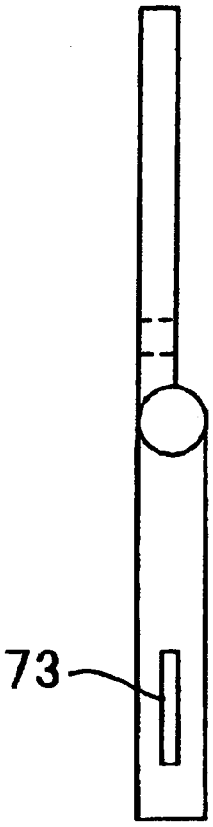
Figure 12A:
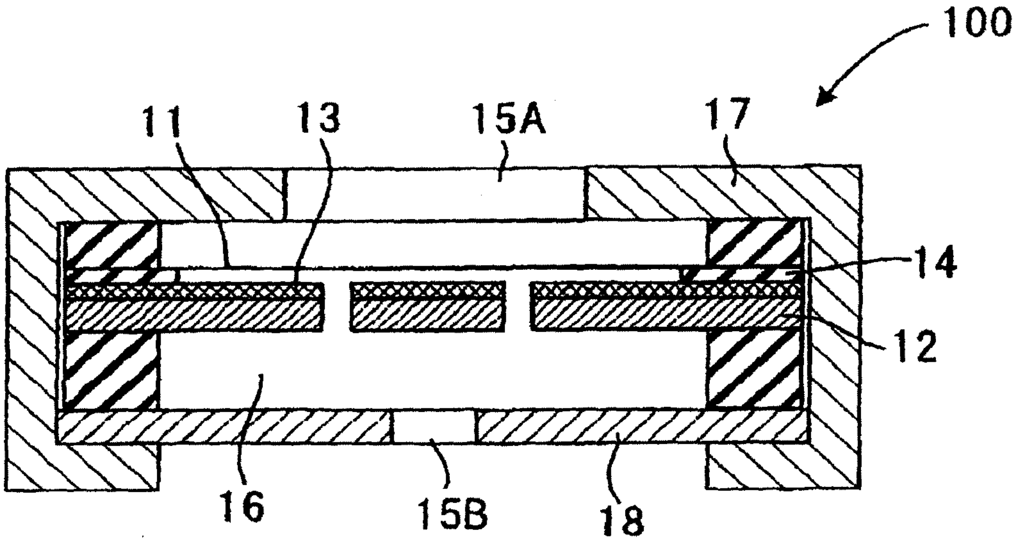
FIG. 12A is a view showing a sectional structure of a conventional unidirectional ECM and FIG. 12B is a view showing a sectional structure of a conventional MEMS microphone.
Figure 12B:
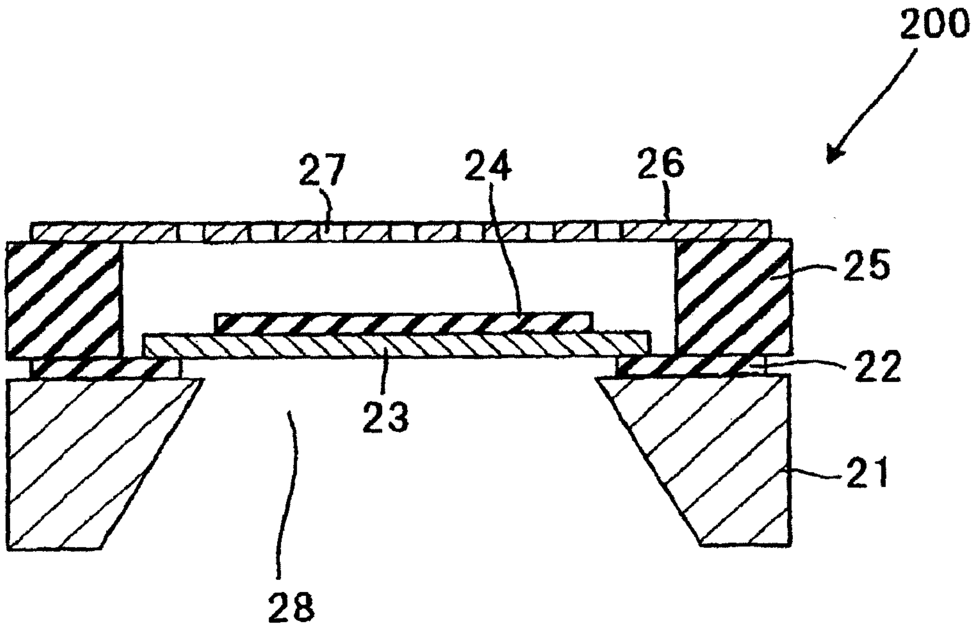
PRIOR ART FIG. 12B

FIG. 11A is a view for explaining an application example of a card type MEMS microphone. FIG. 11B is a side view showing a portable telephone.

As shown in FIGS. 11A and 11B, a portable telephone 71 has a connecting portion 73 into which a card type MEMS microphone 72 is to be inserted. When the card type MEMS microphone 72 is inserted into the connecting portion 73, a terminal of the card type MEMS microphone 72 comes in contact with that, in the connecting portion 73 and they are electrically connected to each other so that the card type MEMS microphone functions as a microphone of the portable telephone 72.

It is preferable to prepare the card type MEMS microphone 72 which has the unidirectional characteristic described in the first or second embodiment, a non-directionality having no through hole on a card substrate, and furthermore, an ultra-directionality causing a directionality to have a narrower angle and a bidirectionality to greatly catch a sound source in two forward and backward directions.

By the structure, a user can change a microphone performance depending on the uses of the portable telephone and a surrounding environment. For example, when the portable telephone is used in a hand-free mode (a use configuration in which a portable telephone is put on a desk to carry out talking), it is sufficient that a card type MEMS microphone having the non-directionality is inserted into the portable telephone. Consequently, a sound collecting performance can be prevented from being changed by the movement of a speaker. When the portable telephone is used in a normal mode (a use configuration in which a user holds the portable telephone by hand and carries out talking), moreover, it is sufficient that a card type MEMS microphone having a unidirectionality is inserted. Consequently, the directionality can be concentrated on a mouth of the speaker. Consequently, it is possible to reduce the influence of surrounding noises.

According to the card type MEMS microphone, thus, it is possible to easily change the microphone characteristic of an electronic apparatus such as a portable telephone.

While the portable telephone has been taken as an example of the electronic apparatus in the embodiment, this is not restricted thereto but the invention can also be applied to an IC recorder or a PHS, for example.

Moreover, the card type MEMS microphone may be mounted on a main substrate in the electronic apparatus in addition to a connection, as an external apparatus, to an electronic apparatus. In this case, the main substrate is put with a cavity portion provided in a mounting intended position in order not to close the through holes of the card type MEMS microphone also after the mounting. Consequently, it is possible to mount the card type MEMS microphone on the main substrate without damaging the characteristic thereof.

While the invention has been described in detail with reference to the specific embodiments, it is apparent to the skilled in the art that various changes and modifications can be made without departing from the spirit and scope of the invention.

The application is based on Japanese Patent Application No. 2006-130299 filed on May 9, 2006, the contents of which are incorporated by reference.

INDUSTRIAL APPLICABILITY

The invention can cause an MEMS microphone to have a directionality and a card type can easily change a directionality of microphones of various apparatuses, which is useful.

The invention claimed is:

1. A card type MEMS microphone comprising:

a substrate having a first through hole and a second through hole;

an MEMS chip in which a space formed by a diaphragm electrode and a silicon substrate is mounted in a position to surround an outlet of the first through hole and which serves to convert a sound signal propagated to the diaphragm electrode into an electric signal; and an acoustic resisting member mounted in a position covering the first through hole at a substrate surface on an opposite side to a side on which the MEMS chip is mounted, wherein the substrate has a terminal for transmitting an electric signal output from the MEMS chip to an electronic apparatus and takes a shape of a card which can be attached to and removed from the electronic apparatus, and the second through hole is a hole which a sound signal passes to be propagated to the diaphragm electrode around the substrate.

2. The card type MEMS microphone according to claim 1, wherein the second through hole takes a shape of a circular arc almost around the MEMS chip.

3. The card type MEMS microphone according to claim 2, wherein when a sound is generated on an opposite side to the substrate surface on which the MEMS chip is mounted, a signal of the sound which passes the acoustic resisting member and the first through hole and is propagated from a back side of the diaphragm electrode and a signal of the sound which passes the second through hole and is propagated from a surface side of the diaphragm electrode reach the diaphragm electrode almost simultaneously.

4. The card type MEMS microphone according to claim 1, wherein when a sound is generated on an opposite side to the substrate surface on which the MEMS chip is mounted, a signal of the sound which passes the acoustic resisting member and the first through hole and is propagated from a back side of the diaphragm electrode and a signal of the sound which passes the second through hole and is propagated from a surface side of the diaphragm electrode reach the diaphragm electrode almost simultaneously.

5. A portable telephone mounting the card type MEMS microphone according to claim 1.

* * * * *